(12) United States Patent
Chen et al.

(10) Patent No.: US 12,417,957 B2
(45) Date of Patent: Sep. 16, 2025

(54) STRUCTURE AND METHOD RELATED TO A POWER MODULE USING A HYBRID SPACER

(71) Applicant: SEMICONDUCTOR COMPONENTS INDUSTRIES, LLC, Scottsdale, AZ (US)

(72) Inventors: Liangbiao Chen, Scarborough, ME (US); Yong Liu, Cumberland Foreside, ME (US); Tzu-Hsuan Cheng, Scarborough, ME (US); Stephen St. Germain, Gilbert, AZ (US); Roger Arbuthnot, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/535,726

(22) Filed: Dec. 11, 2023

(65) Prior Publication Data

US 2024/0136247 A1 Apr. 25, 2024

Related U.S. Application Data

(63) Continuation of application No. 17/655,398, filed on Mar. 18, 2022, now Pat. No. 11,842,942, which is a continuation of application No. 16/784,999, filed on Feb. 7, 2020, now Pat. No. 11,282,764.

(51) Int. Cl.
| | |
|---|---|
| *H01L 23/367* | (2006.01) |
| *H01L 21/56* | (2006.01) |
| *H01L 23/00* | (2006.01) |
| *H01L 23/31* | (2006.01) |
| *H01L 23/373* | (2006.01) |
| *H05K 7/20* | (2006.01) |

(52) U.S. Cl.
CPC ........ *H01L 23/3675* (2013.01); *H01L 21/565* (2013.01); *H01L 23/3107* (2013.01); *H01L 23/3735* (2013.01); *H01L 24/32* (2013.01); *H05K 7/2089* (2013.01); *H01L 2224/32245* (2013.01); *H01L 2224/84801* (2013.01); *H01L 2924/13055* (2013.01)

(58) Field of Classification Search
None
See application file for complete search history.

(56) References Cited

U.S. PATENT DOCUMENTS

| | | |
|---|---|---|
| 6,756,668 B2 | 6/2004 | Baek et al. |
| 7,019,395 B2 | 3/2006 | Hirano et al. |
| 9,275,926 B2 | 3/2016 | Hable et al. |

(Continued)

OTHER PUBLICATIONS

System Plus Consulting, Double Side Cooled 700V 400A IGBT Module Power Semiconductor report by Elena Barbarini Jan. 2018—version 1 (downloaded on Feb. 3, 2020 from https://www.systemplus.fr/wp-content/uploads/2018/01/SP18375_Infineon_double_side_cooling_IGBT_sample.pdf.

*Primary Examiner* — Sue A Purvis
*Assistant Examiner* — Jordan M Klein
(74) *Attorney, Agent, or Firm* — Brake Hughes Bellermann LLP

(57) ABSTRACT

In at least one aspect, a method can include shaping a block of flexible spacer material. The method can include shaping a portion of the block of flexible spacer material to receive a solid metal block. The method can include coupling the solid metal block to the portion of the block of flexible spacer material.

20 Claims, 17 Drawing Sheets

(56) References Cited

U.S. PATENT DOCUMENTS

| | | | |
|---|---|---|---|
| 9,390,996 B2 | 7/2016 | Jeon | |
| 10,215,504 B2 | 2/2019 | Coteus et al. | |
| 2013/0199767 A1* | 8/2013 | Karidis | H01L 21/4882 |
| | | | 228/183 |
| 2013/0214406 A1* | 8/2013 | Schultz | H01L 23/46 |
| | | | 257/713 |
| 2014/0061893 A1 | 3/2014 | Saeidi et al. | |
| 2014/0185243 A1 | 7/2014 | Joo et al. | |
| 2016/0091260 A1* | 3/2016 | Schultz | F28F 3/022 |
| | | | 165/185 |
| 2016/0126157 A1 | 5/2016 | Jeon | |
| 2016/0290728 A1* | 10/2016 | Coteus | H05K 7/20254 |
| 2018/0240730 A1 | 8/2018 | Hirao et al. | |

* cited by examiner

Shape a block of flexible space material to specified outer dimensions of the hybrid spacer block and remove a central portion of the block of flexible space material to accommodate specified dimensions of a solid metal block 410

Apply a first bonding material (e.g., a solder) to a bottom sheet of metal (e.g., a copper foil) 420

Place the shaped block of flexible spacer material and the solid block of metal on the first bonding material applied to the bottom sheet of metal 430

Apply a second bonding material (e.g., a solder) to top surfaces of the shaped block of flexible spacer material and the solid block of metal disposed on the bottom sheet of metal 440

Place a top sheet of metal (e.g., copper foil) over the second bonding material 450

Reflow the solder and cure the assembly to form the hybrid spacer block 460

Shape a block of flexible spacer material to specified outer dimensions of the hybrid spacer block 610

Remove a central portion of the block of flexible spacer material creating an opening to accommodate specified dimensions of a solid metal block 620

Couple vertical side foil panels to the opening 630

Dispense a bottom solder layer on the bottom foil in the opening and place the solid block of metal on the bottom solder layer in the opening 640

Dispense a side solder layer in a space between the vertical side foil panels and the solid block of metal, and a top solder layer on top of the assembly 650

Place a top sheet of metal (e.g., copper foil) over the assembly 660

Reflow the solder and cure the assembly to form the hybrid spacer block 670

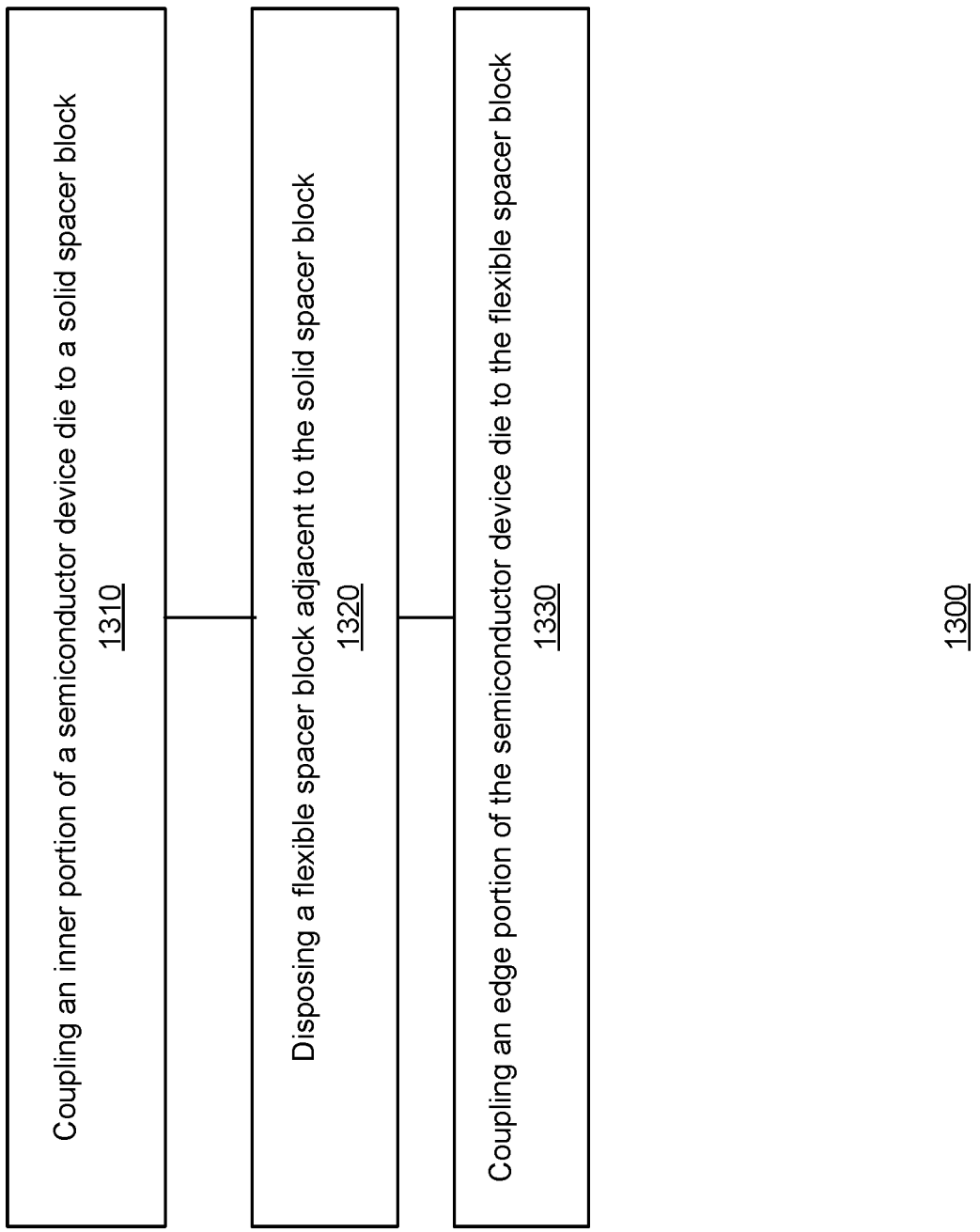

STRUCTURE AND METHOD RELATED TO A POWER MODULE USING A HYBRID SPACER

RELATED APPLICATIONS

This application is a continuation application of U.S. patent application Ser. No. 17/655,398, filed Mar. 18, 2022 as a continuation of U.S. patent application Ser. No. 16/784,999, filed Feb. 7, 2020, both of which are incorporated by reference herein in their entireties.

TECHNICAL FIELD

This description relates to packaging of power devices.

BACKGROUND

Modern high-power devices can be fabricated using advanced silicon technology to meet high power requirements. These high-power devices (e.g., silicon power devices such as an insulated-gate bipolar transistor (IGBT), a fast recovery diode (FRD), etc.) may be packaged in single-side cooling (SSC) or dual-side cooling (DSC) power modules. High-power devices that can deliver or switch high levels of power can be used in, for example, vehicles powered by electricity (e.g., Electric vehicles (EVs), hybrid electric vehicles (HEVs) and plug-in-electric vehicles (PHEV)). The larger size and thicknesses of the high-power device die can create problems such as die warpage and die damage during packaging of the high-power devices for use in circuit packages or power modules (e.g., SSC or DSC power modules), or during stress tests of the fabricated high-power devices.

SUMMARY

In some aspects, the techniques described herein relate to a method, including: shaping a block of flexible spacer material; shaping a portion of the block of flexible spacer material to receive a solid metal block; and coupling the solid metal block to the portion of the block of flexible spacer material.

In some aspects, the techniques described herein relate to a method, wherein the block of flexible spacer material has a corrugated structure made of alternate rectangular ridges and grooves with vertical sidewalls.

In some aspects, the techniques described herein relate to a method, wherein the block of flexible spacer material has a corrugated structure including flexible structures that have non-vertical sidewalls.

In some aspects, the techniques described herein relate to a method, wherein shaping the portion of the block of flexible spacer material to receive the solid metal block includes cutting an opening in the block of flexible spacer material.

In some aspects, the techniques described herein relate to a method, wherein coupling the solid metal block to the portion of the block of flexible spacer material includes disposing the solid metal block in the opening in the block of flexible spacer material.

In some aspects, the techniques described herein relate to a method, further including: applying a first bonding material to a first sheet of metal and placing the block of flexible spacer material including the solid metal block on the first sheet of metal.

In some aspects, the techniques described herein relate to a method wherein the first sheet of metal is a copper foil.

In some aspects, the techniques described herein relate to a method, further including: applying a second bonding material to a top surface of the block of flexible spacer material including the solid metal block placed on the first sheet of metal and placing a second sheet of metal over the second bonding material.

In some aspects, the techniques described herein relate to a method, wherein the second sheet of metal is a copper foil.

In some aspects, the techniques described herein relate to a method, wherein the first bonding material and the second bonding material are solders, and the method further includes reflowing the solders and heat curing the first bonding material and the second bonding material.

In some aspects, the techniques described herein relate to a method, wherein coupling the solid metal block to the portion of the block of flexible spacer material includes adding side foil panels to the opening.

In some aspects, the techniques described herein relate to a method further including: coupling a semiconductor die to the solid metal block in a semiconductor device module.

In some aspects, the techniques described herein relate to a method, wherein coupling the semiconductor die includes coupling an inner portion of the semiconductor die to the solid metal block, and coupling an outer portion of the semiconductor die to the block of flexible spacer material.

In some aspects, the techniques described herein relate to a method, including: shaping a block made of flexible spacer material, the flexible spacer material including flexible structures that have non-vertical walls; forming an opening in the block of flexible spacer material; disposing vertical side foil panels in the opening; and disposing a solid metal block in the opening in the block of flexible spacer material.

In some aspects, the techniques described herein relate to a method, wherein the flexible spacer material includes a plurality of flexible fins attached to a bottom foil.

In some aspects, the techniques described herein relate to a method further including dispensing a bottom solder layer on the bottom foil in the opening, and disposing the solid metal block on the bottom solder layer in the opening.

In some aspects, the techniques described herein relate to a method further including: dispensing a side solder layer in a space between the vertical side foil panels and the solid metal block.

In some aspects, the techniques described herein relate to a method further including: disposing a top solder layer on the block of flexible spacer material including the solid metal block.

In some aspects, the techniques described herein relate to a method further including reflowing the bottom solder layer, the top solder layer, and the side solder layer.

In some aspects, the techniques described herein relate to a method, including: coupling a flexible spacer block and a solid metal block to form a hybrid spacer block; coupling an inner portion of a semiconductor die to the solid metal block; and coupling an outer portion of the semiconductor die to the flexible spacer block, wherein the flexible spacer block is a strip attached to, and extending from, a side of the solid metal block toward an edge of the semiconductor die.

In some aspects, the techniques described herein relate to a method, wherein the flexible spacer block has a corrugated structure made of at least one of a straight fin, a tilted fin, a bent fin, a curved fin, or an S-shaped fin.

In some aspects, the techniques described herein relate to a method further including: bonding the hybrid spacer block to a substrate, the hybrid spacer block providing a thermal pathway for heat generated in the semiconductor die to the substrate.

The details of one or more implementations are set forth in the accompanying drawings and the description below. Other features will be apparent from the description and drawings, and from the claims.

BRIEF DESCRIPTION OF THE DRAWINGS

FIG. 4 illustrates an example method for assembling a hybrid spacer block.

FIG. 6 illustrates an example method for assembling a hybrid spacer block.

FIG. 13 illustrates an example method of using a flexible spacer block in a power module.

DETAILED DESCRIPTION

Figure 1A:
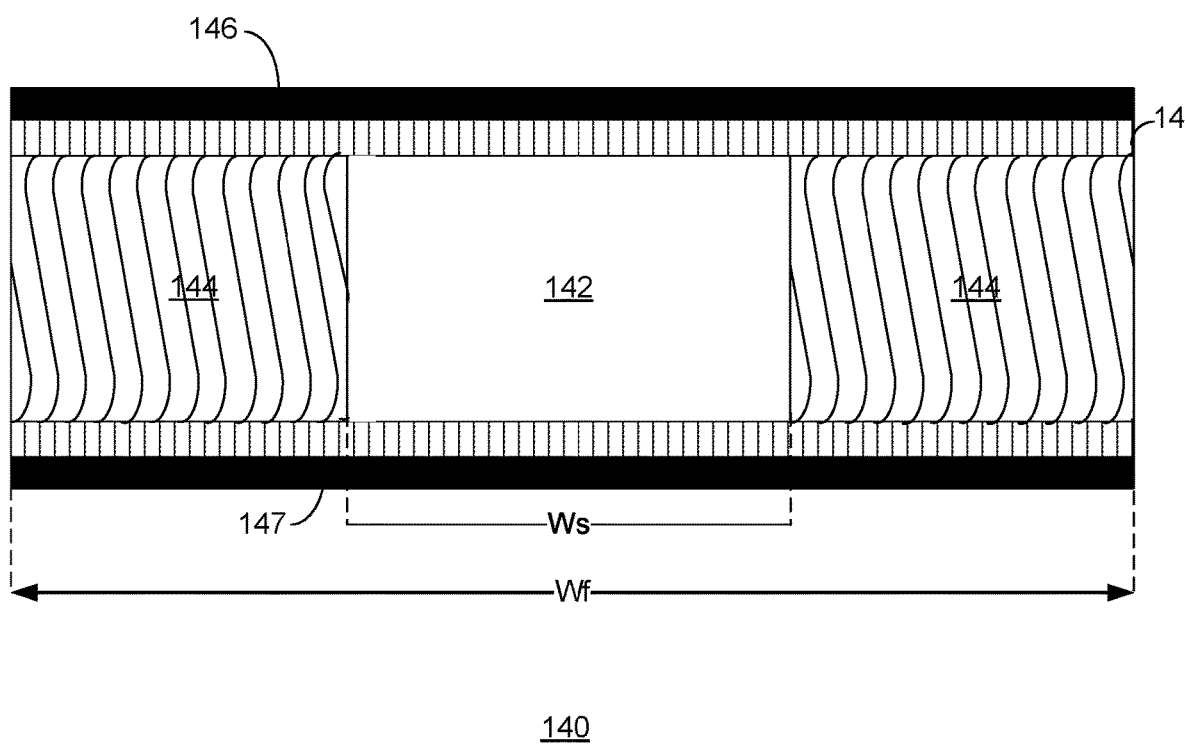
FIG. 1A is a block diagram illustrating an example hybrid spacer block.

Modern high-power semiconductor devices can be fabricated using advanced silicon technologies to meet the high power requirements. The power devices (e.g., an insulated-gate bipolar transistor (IGBT), a fast recovery diode (FRD), etc.) may be fabricated using, for example, one or more of silicon (Si), silicon carbide (SiC), and gallium nitride (GaN) materials, or other semiconductor materials. The power devices may be fabricated on thinned semiconductor wafers (e.g., silicon wafers) that are, for example, only about 100 microns thick or less. This results in high-power device die sizes that are larger and thinner than power device die sizes for traditional power devices fabricated on regular substrates (i.e., on un-thinned silicon wafers) using conventional silicon technologies.

In circuit packages (e.g., a dual-side cooling (DSC) power module), the semiconductor device die can be placed between a pair of direct bonded copper (DBC) substrates that help conduct heat away from the semiconductor device die. The individual thinned device die can be mechanically and structurally reinforced by bonding (e.g. soldering) a supporting spacer block (i.e., a thermally conducive spacer block) to a backside of the die. The spacer also provides good electrical isolation and thermal performance. The other side of the supporting spacer block can be bonded to a DBC substrate. The supporting spacer block provides a thermal pathway for heat flow from the semiconductor device die to the DBC substrate. In a DSC power module, the die-supporting block combination is placed between the between the pair of DBC substrates and encapsulated in molding material (e.g., epoxy molding compound (EMC). In instances in which the die is placed in a flip-chip configuration on a DBC substrate, a molded underfill (MUF) molding material can be introduced to underfill a narrow gap under the flip-chip die, and over molding the die-supporting block combination for encapsulation.

In some implementations, the supporting spacer block is a solid piece of thermally conductive material (e.g., a rectangular solid copper block having a cross sectional area A and a thickness T). The thickness of the thin device die is augmented by the thickness of the solid copper block in the die-supporting spacer block combination. The solid copper block can have a smaller cross sectional area than the area of device die or can have a larger cross sectional area that may be comparable to the area of the device die. However, cracks in the die can form around the solid copper block when the block area is smaller than die area. Use of solid copper blocks that have larger areas (e.g., greater or comparable to the area of the device die) has been proposed as a remedy, but large area solid copper blocks also result in die cracking. Solder voids may form between a larger area solid copper block and die in the die-supporting spacer block combination. These solder voids can induce die corner cracks at die corners.

A cause of the die corner cracks may be a coefficient of thermal expansion (CTE) mismatch between the spacer block (e.g., a copper block) and the MUF (or EMC) used in the die-supporting spacer block combination. As the copper spacer block shrinks faster than the MUF (or EMC) on cooling, the MUF (or EMC) will oppose the die motion induced by shrinkage of the solid copper spacer block at a die corner with the solder voids and lead to stress that creates the die corner cracks.

In accordance with the principles of the present disclosure, a hybrid spacer block for a die-supporting spacer block combination has a hybrid structure that includes a solid block spacer portion and a mechanically elastic or flexible block spacer portion. The solid spacer block portion may have a cross sectional area that is smaller than the die area. The solid spacer block portion may be an inner portion (central portion) of the hybrid spacer block. The flexible block spacer portion may be disposed around (e.g., surrounding, or adjacent) the solid spacer block portion. The flexible spacer block portion and the solid spacer block portion in combination may have a cross sectional area that is comparable to or greater than the die area. In the die-supporting spacer block combination, the flexible spacer block portion may extend to the die corners and may flexibly accommodate any mechanical displacements due to CTE mismatch between the components (e.g., metal, EMC and die semiconductor). This flexible accommodation of mechanical displacements due to CTE mismatch may prevent die cracking at die corners, and reduce instances of solder peeling failure under the device pads (e.g., signal pads) in a DSC power module that utilizes the die-supporting spacer block combination.

FIG. 1A shows a cross sectional view of an example hybrid spacer block 140, in accordance with the principles of the present disclosure. The hybrid spacer block 140 may include a solid metal block 142 (e.g., a solid copper block) that is surrounded (e.g., entirely surrounds, at least partially surrounds) by a flexible spacer block 144 (e.g., a mechanically flexible copper block). Solid metal block 142 may have a width Ws. Hybrid spacer block 140 including flexible spacer block 144 may have width Wf. Solid metal block 142 and flexible spacer block 144 may be disposed between metal sheets 146 and 147 (e.g., copper sheets or foils) and held in place between metal sheets 146 and 147 by solder (e.g., solder 14).

Figure 1B:
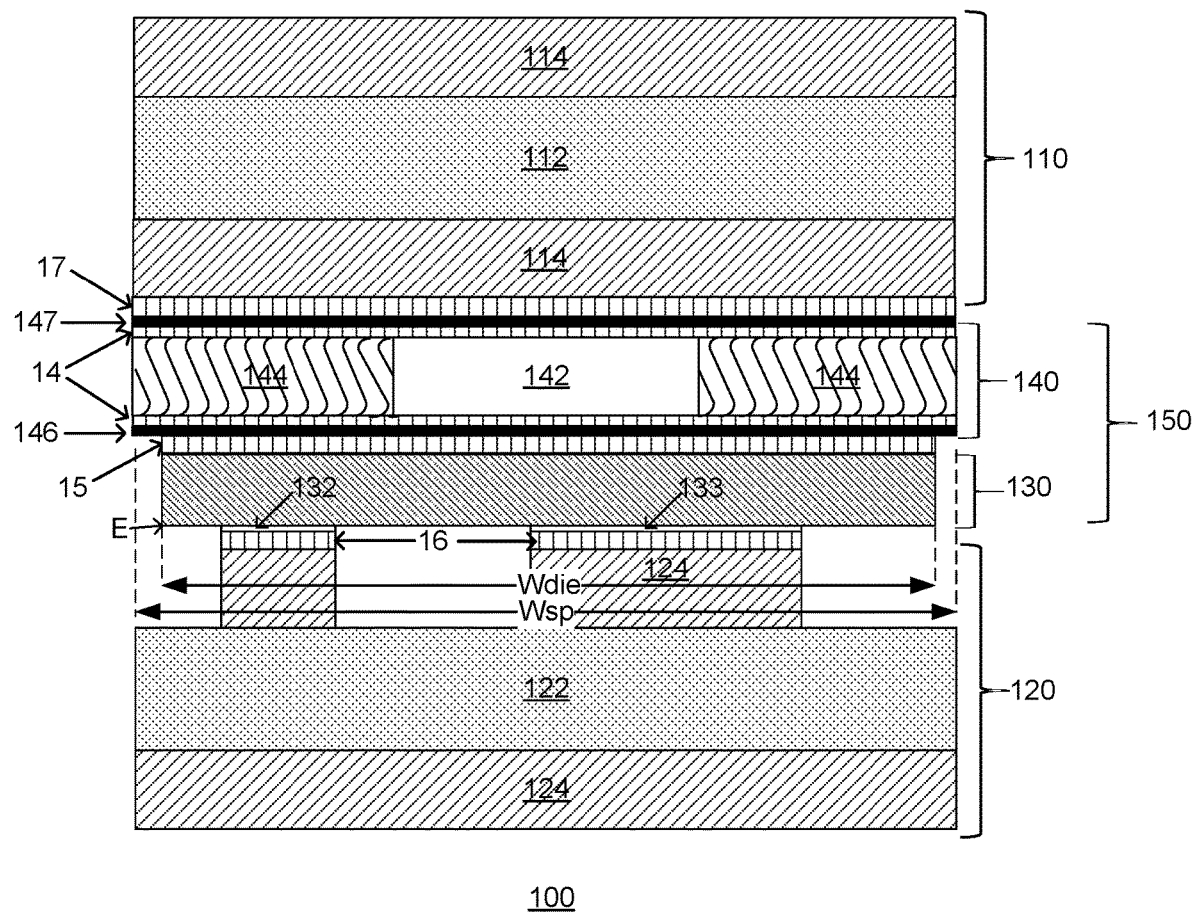
FIG. 1B is a block diagram illustrating an example power module utilizing a hybrid spacer block for a die-supporting spacer block combination.

FIG. 1B shows a cross sectional view of an example DSC power module 100 utilizing a hybrid spacer block 140 in a die-supporting spacer block combination, in accordance with the principles of the present disclosure. The example DSC power module 100 can utilize the hybrid spacer block 140 discussed in connection with at least FIG. 1A.

DSC power module 100 may enclose a device die 130 and a hybrid spacer block 140 between two DBC substrates (e.g., DBC substrate 110 and DBC substrate 120). On one side the hybrid spacer block (e.g., hybrid spacer block 140) is coupled to the device die 130, and on another side the hybrid spacer block is bonded to one of the two DBC substrates (e.g., DBC substrate 110). The hybrid spacer block provides a thermal pathway for heat generated in the device die to be dissipated over DBC substrate 110.

Hybrid spacer block 140 may include a solid metal block 142 (e.g., a solid copper block) that is surrounded by a flexible spacer block 144 (e.g., a mechanically flexible copper block). Solid metal block 142 and flexible spacer block 144 may be disposed between metal sheets 146 and 147 (e.g., copper sheets or foils) and held in place between metal sheets 146 and 147 by solder (e.g., solder 14). Device die 130 (e.g., an IGBT device) may be bonded (e.g., soldered) to hybrid spacer block 140 via a solder layer 15 forming a die-spacer block combination 150 of DSC power module 100. An inner portion of device die 130 may be bonded to solid metal block 142. An outer portion of the device die (e.g., extending from the inner portion to an edge E of the device die) may be bonded to the flexible spacer block 144. In example implementations, as shown in FIG. 1B, hybrid spacer block 140 may have a width Wsp that is about a same or greater that a width Wdie of device die 130. In this geometrical arrangement, any displacement of device die edge E (e.g., device die bending induced by thermal mismatch of components) can be accommodated (e.g., mechanically) by the elasticity of flexible spacer block 144 and die cracking can be prevented.

In example implementations, as shown in FIG. 1B, DBC substrate 110 and DBC substrate 120 may be ceramic tiles (e.g., alumina tiles 112, 122) that are plated with copper layers (e.g., layers 114, 124). Device die 130 (e.g., an IGBT device) may have one or more contact pads (e.g., signal pads 132 and source pads 133).

In example implementations, as shown in FIG. 1B, DSC power module 100 may be assembled, for example, with die-spacer block combination 150 in an orientation that has device 130 in a flip chip configuration. Device 130 in the flip chip configuration may have signal pads 132 and source pads 133 bonded to DBC substrate 120 via a solder layer 16. Further, hybrid spacer block 140 (of die-spacer block combination 150) may be bonded to DBC substrate 110 via a solder layer 17.

Figure 2A:
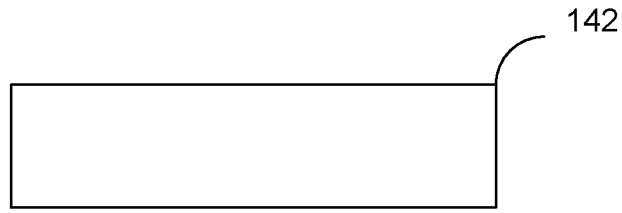
FIG. 2A illustrates a solid block.

The mechanically elastic or flexible spacer material used for flexible spacer block 144 in hybrid spacer block 140 can be of different types. FIGS. 2B through 2F show cross sectional views of different types of flexible spacer configurations that may be used in hybrid spacer block 140. FIG. 2A shows, for comparison, a cross sectional view of solid metal block 142.

Figure 2B:
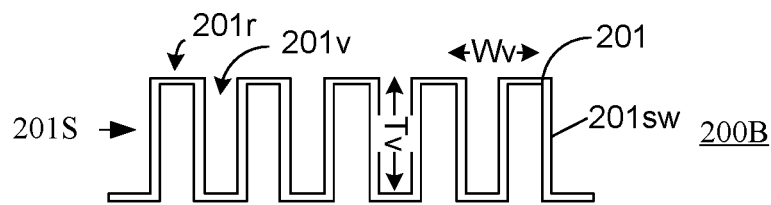
FIGS. 2B through 2F illustrate different types of flexible spacer configurations that can be used in a hybrid spacer block.

FIG. 2B illustrates example flexible spacer material 200B that includes a corrugated structure 201S made of straight fins (e.g., straight fin 201). As pictorially shown in FIG. 2B, the straight fins may be arranged so that corrugated structure 201S is made of alternate rectangular ridges 201r and grooves or valleys 201v with vertical sidewalls 201sw formed by the straight fins 201. Ridges 201r and valleys 201s may alternate with a spatial periodicity Wv. Valleys 201v with vertical sidewalls 201sw may have a height Tv.

Figure 2C:
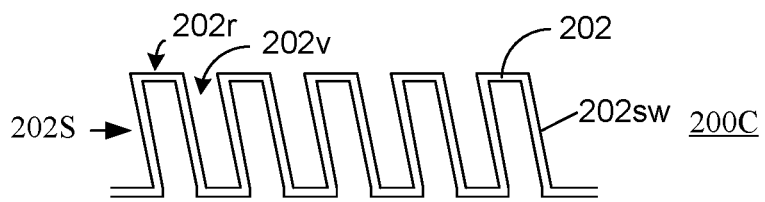

FIG. 2C illustrates example flexible spacer material 200C that includes a corrugated structure 202S made of tilted fins (e.g., tilted fin 202). As pictorially shown in FIG. 2C, the tilted fins may be arranged so that corrugated structure 202S is made of alternate ridges 202r and grooves or valleys 202v with slanted or tilted sidewalls 202sw formed by the tilted fins 202.

Figure 2D:
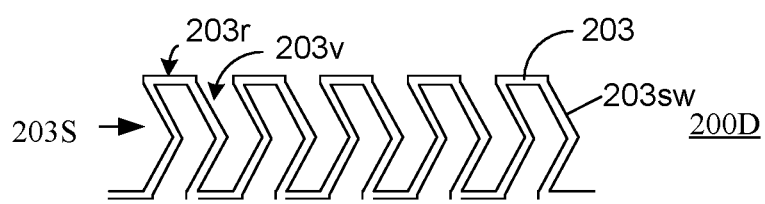
Figure 2E:
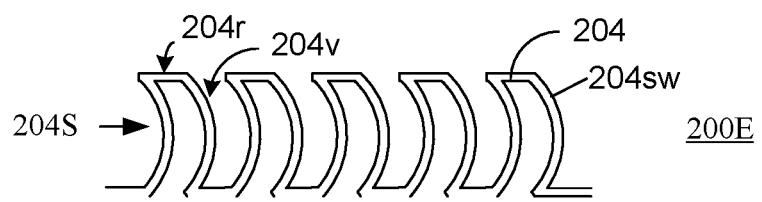

FIG. 2D illustrates example flexible spacer material 200D that includes a corrugated structure 203S made of bent fins (e.g., bent fin 203). As pictorially shown in FIG. 2C, the bent fins may be arranged so that corrugated structure 203S is made of alternate ridges 203r and grooves or valleys 202v formed by bent fins 203 with bent sidewalls 203sw FIG. 2E illustrates example flexible spacer material 200E that includes a corrugated structure 204S made of curved fins (e.g., curved fin 204). As pictorially shown in FIG. 2E, the curved fins may be arranged so that corrugated structure 204S is made of alternate rectangular ridges 204r and grooves or valleys 204v formed by curved fins 204 with curved sidewalls 204sw.

Figure 2F:
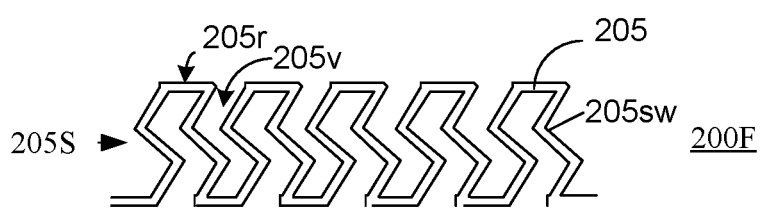

FIG. 2F illustrates example flexible spacer material 200F that includes a corrugated structure 205S made of S-shaped fins (e.g., S-shaped fin 205). As pictorially shown in FIG. 2F, the S-shaped fins may be arranged so that corrugated structure 205S is made of alternate rectangular ridges 205r and grooves or valleys 205v formed by S-shaped fins 204 with S-shaped sidewalls 205sw.

The different types of flexible spacer material with the different types of fin structure (e.g., straight fin 101, tilted fin 202, bent fin 203, curved fin 204, and S-shaped fin 205, etc.) may impart different mechanical and thermal properties to flexible spacer block 144.

FIGS. 1A and 1i, as discussed above, show, for example, an implementation in which flexible spacer block 144 is made of flexible spacer material of the S-shaped fin type (i.e., S-shaped fin 205).

Figure 3:
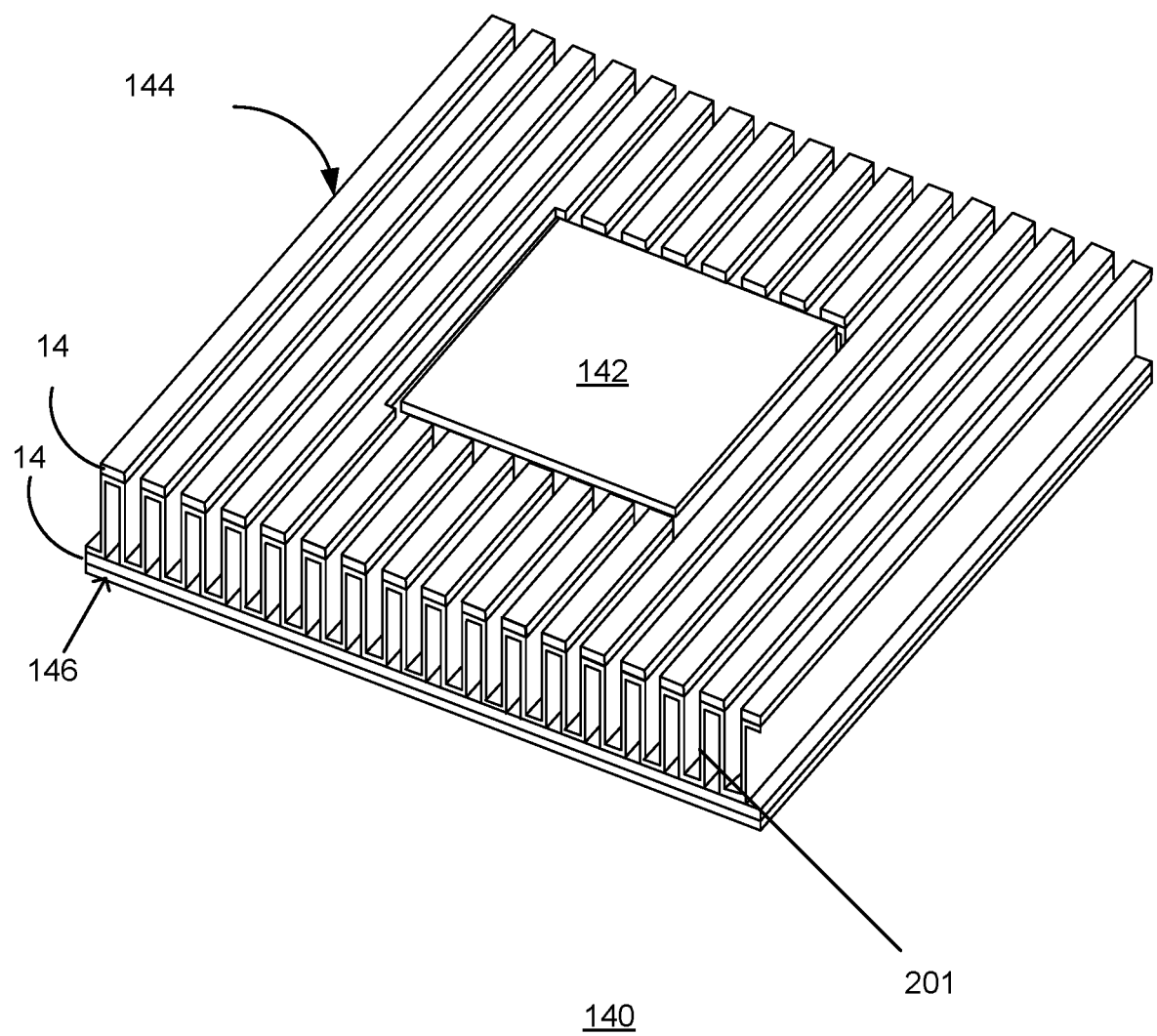
FIG. 3 illustrates an example hybrid spacer block.

FIG. 3 shows, for example, an implementation in which hybrid spacer block 140 uses material of the straight fin type (i.e., straight fin 201) for flexible spacer block 144. As shown in FIG. 3, in hybrid spacer block 140, flexible spacer block 144 may surround and be coupled to a solid spacer block (e.g., solid metal block 142).

FIG. 4 shows an example method 400 for assembling a hybrid spacer block (e.g., hybrid spacer block 140) for use in die-spacer block combination in a power module.

Method 400 includes shaping a block of flexible spacer material to specified outer dimensions of the hybrid spacer block and preparing an inner portion of the block of flexible spacer material to accommodate specified dimensions of a solid metal block (410). The specified outer dimensions of the hybrid spacer block may match the dimensions of the semiconductor die in the die-spacer block combination.

Preparing the inner portion of the block of flexible spacer material to accommodate specified dimensions of a solid metal block 410 may include removing a portion of the block of flexible spacer material to create an opening (e.g. by cutting out a hole) in the block of flexible spacer material. Preparing the inner portion may include adding side foil panels (e.g., copper foil) to the opening or hole.

Method 400 may further include applying a first bonding material (e.g., a solder) to a bottom sheet of metal (e.g., a copper foil) (420), placing the shaped block of flexible spacer material and the solid block of metal on the first bonding material applied to the bottom sheet of metal (430). Method 400 further includes applying a second bonding material (e.g., a solder) to top surfaces of the shaped block of flexible space material and the solid block of metal disposed on the bottom sheet of metal (440), placing a top sheet of metal (e.g., copper foil) over the second bonding material (450), and reflowing the solder and curing the assembly to form the hybrid spacer block (460).

FIGS. 5A through 5I show the hybrid spacer block (e.g., hybrid spacer block 140) at different stages of assembly by method 400 starting with a block of flexible spacer material 500.

Figure 5B:
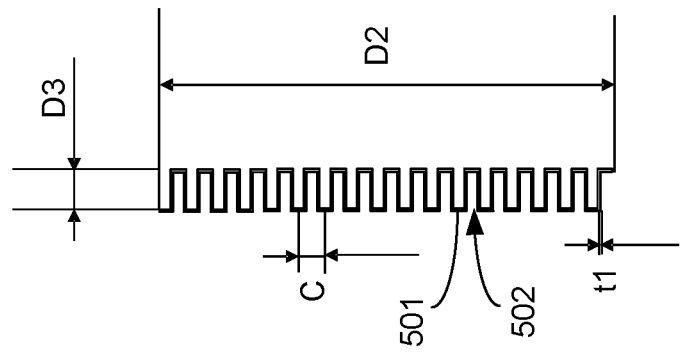
FIGS. 5A through 5I illustrate a hybrid spacer block at different stages of assembly by the method of FIG. 4.
Figure 5A:
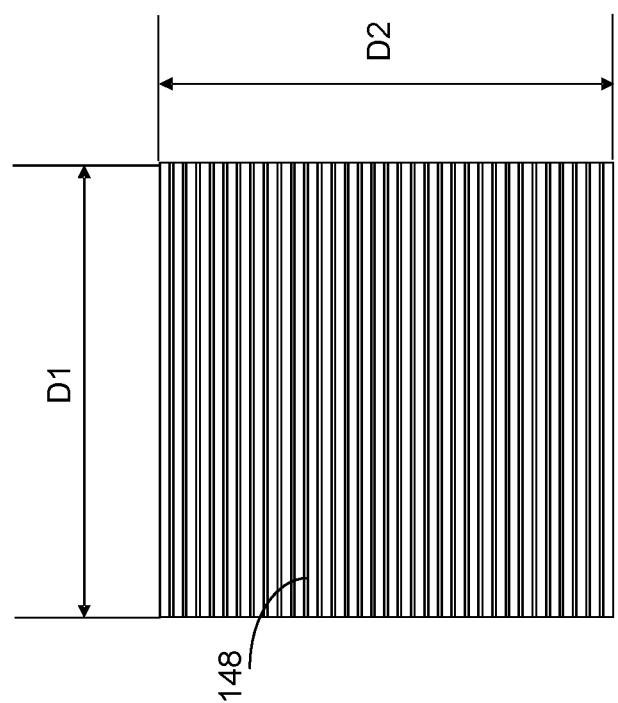

FIGS. 5A and 5B show a starting block of flexible spacer material 500 that can be utilized to make hybrid spacer block 140 according to method 400. In an example implementation, flexible spacer material 500 may have a straight fin structure, i.e., a corrugated structure 148 made of alternate rectangular ridges 501 and grooves 502 with vertical sidewalls.

FIG. 5A shows a top view of flexible spacer material 500 having, for example, rectangular slab dimensions D1×D2 and a thickness D3. In example implementations, the dimensions D1 and D2 each may be greater than about 10 millimeters, and thickness D3 may be in the range of 0.5 to 3.0 millimeters.

FIG. 5B shows a cross sectional view of starting block of flexible spacer material 500 depicting the ridges and grooves of corrugated structure 148 having a thickness D3. Corrugated structure 148 may be formed, for example, by rippling a thin metallic sheet (e.g., a copper sheet) having a thickness t1 to form ridges 501 and grooves 502. In example implementations, the thickness t1 may be in the range of 0.05 to 3.0 millimeters. Each cell of the corrugated structure (i.e., ridge-to ridge distance) may have a spacing C. In example implementations, spacing C may be in the range of 0.5 to 2 millimeters.

Figure 5D:
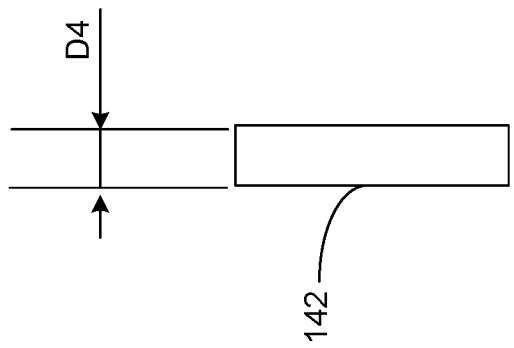
Figure 5C:
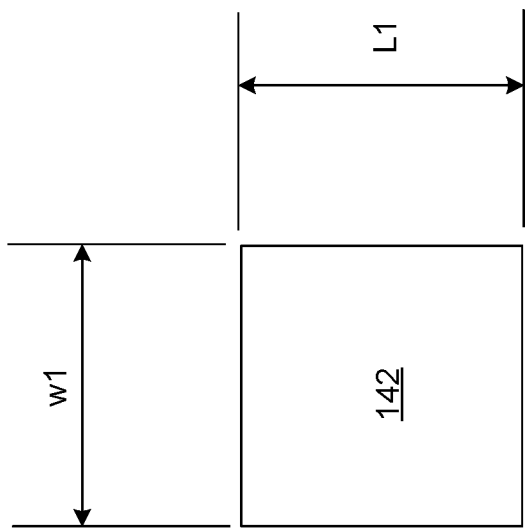

FIGS. 5C and 5D show a block of solid material (e.g., solid metal block 142) that can be used in hybrid spacer block 140, according to method 400. FIG. 5C shows a top view of solid metal block 142 having, for example, rectangular slab dimensions W1×L1. FIG. 5D shows a side view of solid metal block 142 having, for example, a thickness D4. In example implementations, the dimensions W1 and L1 each may be smaller than about 50 millimeters, and thickness D4 may be in the range of 0.5 to 3.0 millimeters.

Figure 5G:
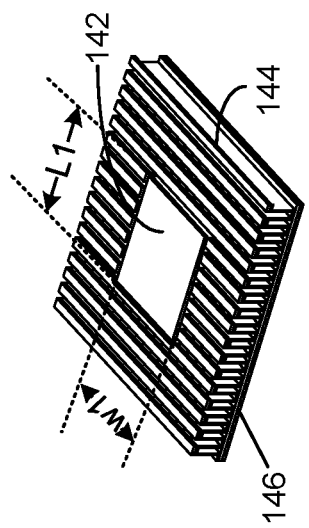
Figure 5F:
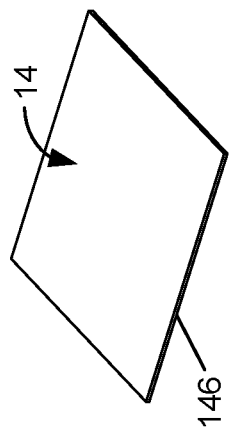
Figure 5I:
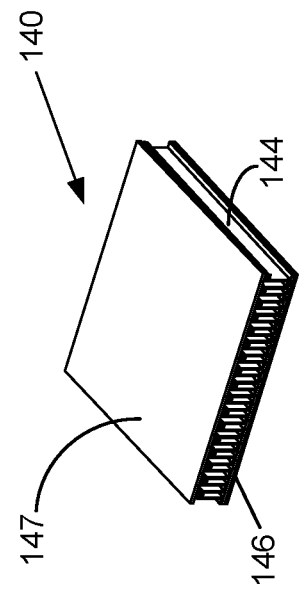
Figure 5E:
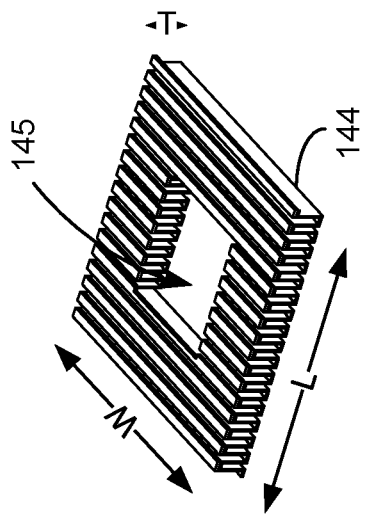

FIG. 5E shows flexible spacer block 144 that has been shaped (from flexible spacer material 500) to specified outer dimensions of the hybrid spacer block (e.g., at 410, method 400). Flexible spacer block 144 may, for example, have a width W, a length L, and a thickness T that correspond to specified outer dimensions of the hybrid spacer block 140. Further, an open inner portion 145 of flexible spacer block is cut out to accommodate specified dimensions of solid metal block 142 of hybrid spacer block 140. Inner portion 145 may, for example, have rectangular dimensions L1×W1 matching the dimension of solid metal block 142 (FIG. 5C).

FIG. 5F shows a first bonding material (e.g., solder 14) being applied to a metal sheet 146 that may form a bottom support for flexible spacer block 144 and solid metal block 142 in hybrid spacer block 140 (e.g., at 420, method 400).

FIG. 5G shows flexible spacer block 144 and solid metal block 142 assembled on bottom metal sheet 146 with solid metal block 142 placed in a hole (e.g., open inner portion 145) in flexible spacer block 144 (e.g., at 430, method 400).

Figure 5H:
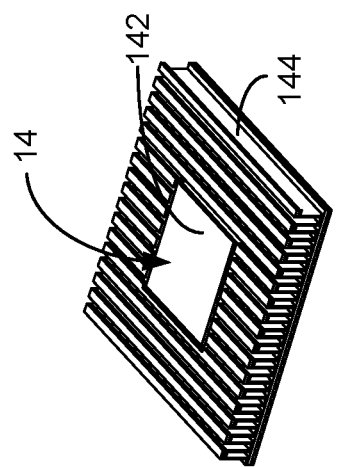

FIG. 5H shows a second bonding material (e.g., a solder 14) applied to top surfaces of the shaped block of flexible spacer material and the solid block of metal disposed on the bottom metal sheet 146 (e.g., at 440, method 400).

FIG. 5I shows a top sheet of metal (e.g., metal sheet 147) placed over the second bonding material of the assembly of FIG. 5F (e.g., at 450, method 400). The assembly may be heated for solder reflow and curing to bond the top and bottom metal sheets 146, 147 to the assembly components and, thus, form hybrid spacer block 140).

In an example implementations discussed above with reference to FIGS. 5A-5I, flexible spacer material 500 has a straight fin structure (i.e., a corrugated structure 148 made of alternating rectangular ridges 501 and grooves 502 with vertical sidewalls). In other implementations, flexible spacer material 500 may have other types of flexible structures with non-vertical sidewalls (e.g., tilted fin 202, bent fin 203, curved fin 204, and S-shaped fin 205, etc., shown in, for example, FIGS. 2B through 2F).

FIG. 6 shows an example method 600 for assembling a hybrid spacer block (e.g., hybrid spacer block 140) using starting flexible materials that have flexible structures that have non-vertical walls (e.g., a structure with S-shaped fin 205). In such spacer materials, the flexible fins (e.g., S fins) may be pre-attached to a bottom foil.

Method 600 includes shaping a block of flexible spacer material to specified outer dimensions of the hybrid spacer block (610) and removing an inner portion of the block of flexible spacer material to create an opening that can accommodate specified dimensions of a solid metal block (620), and coupling (e.g., adding) vertical side foil panels to the opening (630).

Method 600 further includes dispensing a bottom solder layer on the bottom foil in the opening and placing the solid block of metal on the bottom solder layer in the opening (640). Method 600 further includes dispensing a side solder layer in a space between the vertical side foil panels and the solid block of metal, and a top solder layer on top of the assembly (650), and placing a top sheet of metal (e.g., copper foil) over the assembly (660), and reflowing the solder and curing the assembly to form the hybrid spacer block (670).

FIGS. 7A through 7D show the hybrid spacer block (e.g., hybrid spacer block 140) at different stages of assembly by method 600 starting with a block of flexible spacer material with S-shaped fins.

Figure 7A:
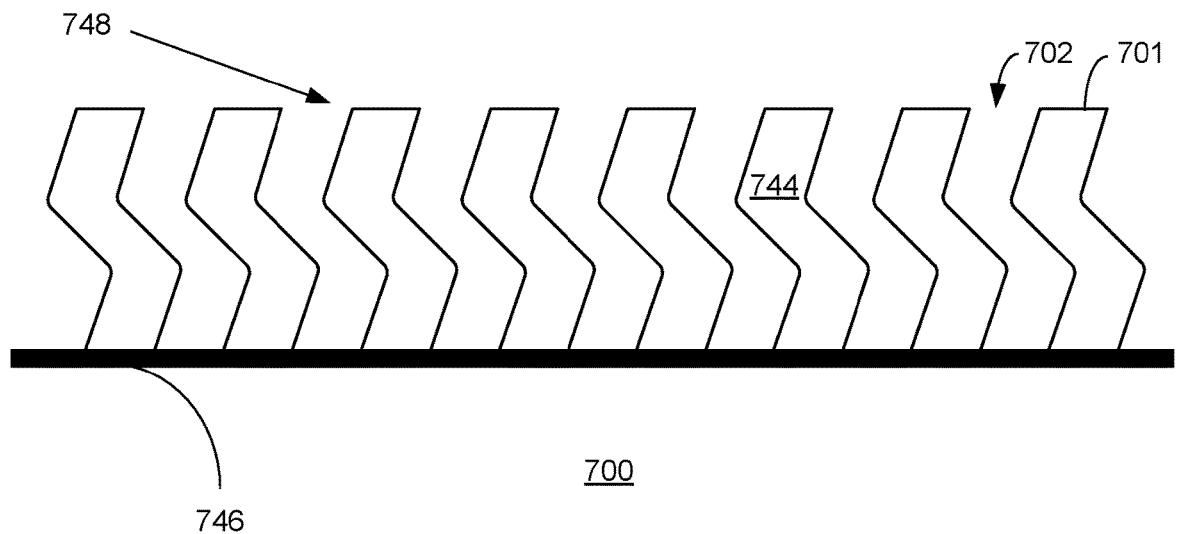
FIGS. 7A through 7D illustrate a hybrid spacer block at different stages of assembly by the method of FIG. 6.

FIG. 7A shows a cross sectional view a block of flexible spacer material 700 shaped to specified outer dimensions of the hybrid spacer block. Flexible spacer material 700 may have a S-shaped fin structure (i.e., a corrugated structure 748 made of alternate ridges 701 and grooves 702 formed by S-shaped fins 744 with non-vertical vertical sides). The S-shaped fins may be attached to a bottom metal sheet 746.

Figure 7B:
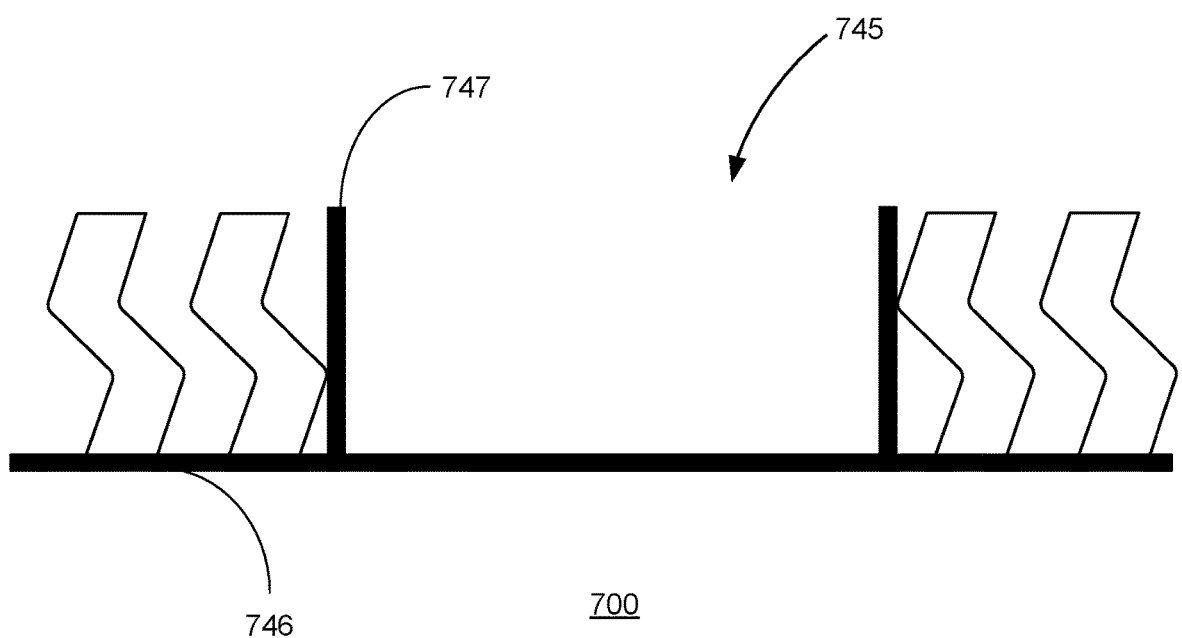

FIG. 7B shows a cross sectional view of the block of flexible spacer material 700 after removal of an inner portion of the block to create an opening 745, and the adding of vertical side foil panels 747 to opening 745. The dimensions of opening 745 may match the dimensions of solid metal block 142.

Figure 7C:
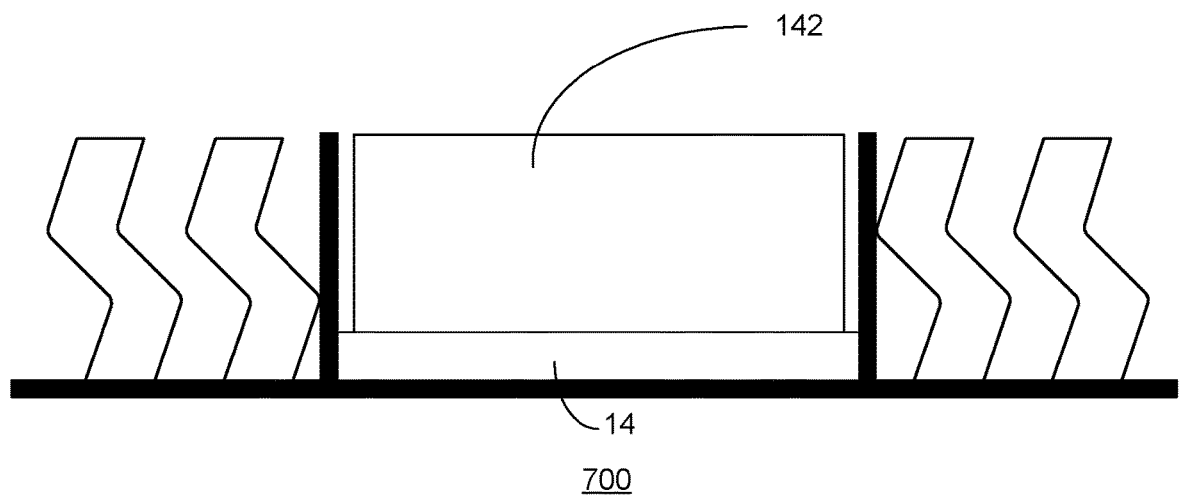

FIG. 7C shows a solder layer 14-1 dispensed on bottom metal sheet 746 and solid metal block 142 placed on solder layer 14-2 in opening 745.

Figure 7D:
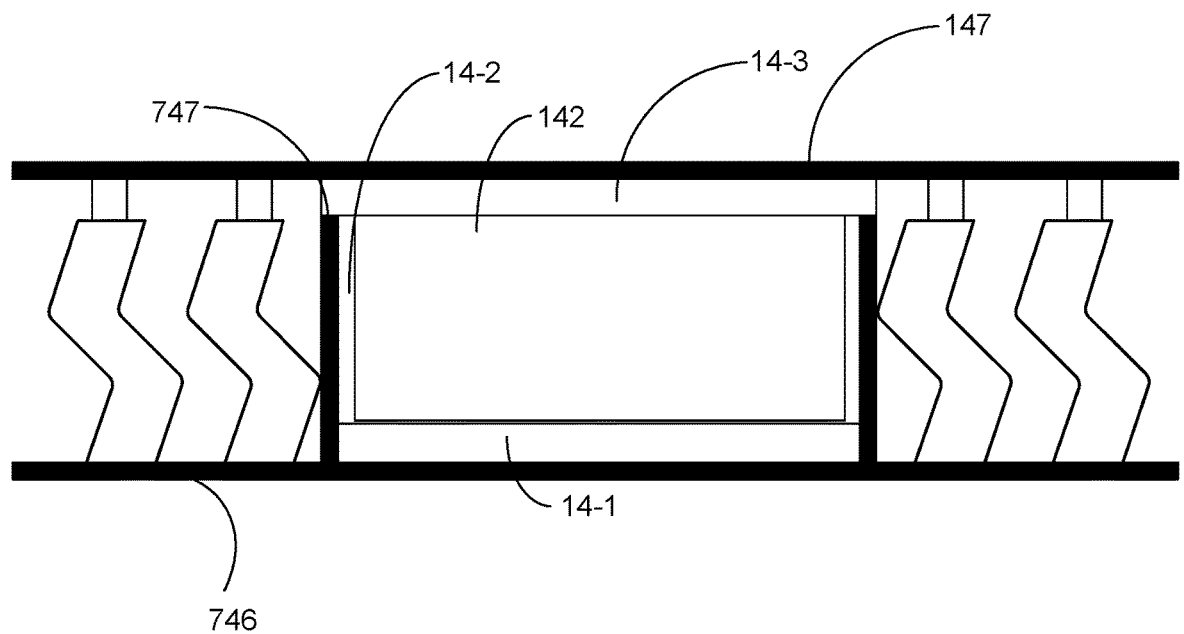

FIG. 7D shows a solder layer 14-2 introduced in a space between vertical side foil panels 747 and the solid metal block 142 in opening 745, and a solder layer 14-3 dispensed on top of the assembly. Further, a top sheet of metal (e.g., metal sheet 147) is placed over solder layer 14-3 on top of the assembly. The assembly may be heated for solder reflow and curing of solder layers 14-1, 14-2, and 14-3 to bond the top and bottom metal sheets 146, 147 to the assembly components and, thus, form hybrid spacer block 140.

In example implementations, the hybrid spacer blocks described herein than include both a solid block portion and a flexible block portion can improve the reliability of power modules. The flexible block portion of a hybrid spacer block can accommodate mechanical displacements of components induced by CTE mismatch between components and reduce die stress and solder peeling strain in the power module. The solid block portion can be used meet thermal and electrical performance requirements of the power module. Mechanical, thermal, and electrical performance of the power module can be optimized by adjusting the size, shape, and material of the solid block portion. A design of the flexible portion of the spacer (i.e., corrugated, fin, Z-shape, etc.) can also be used to tune the mechanical, thermal, and electrical performance characteristics.

Figure 8:
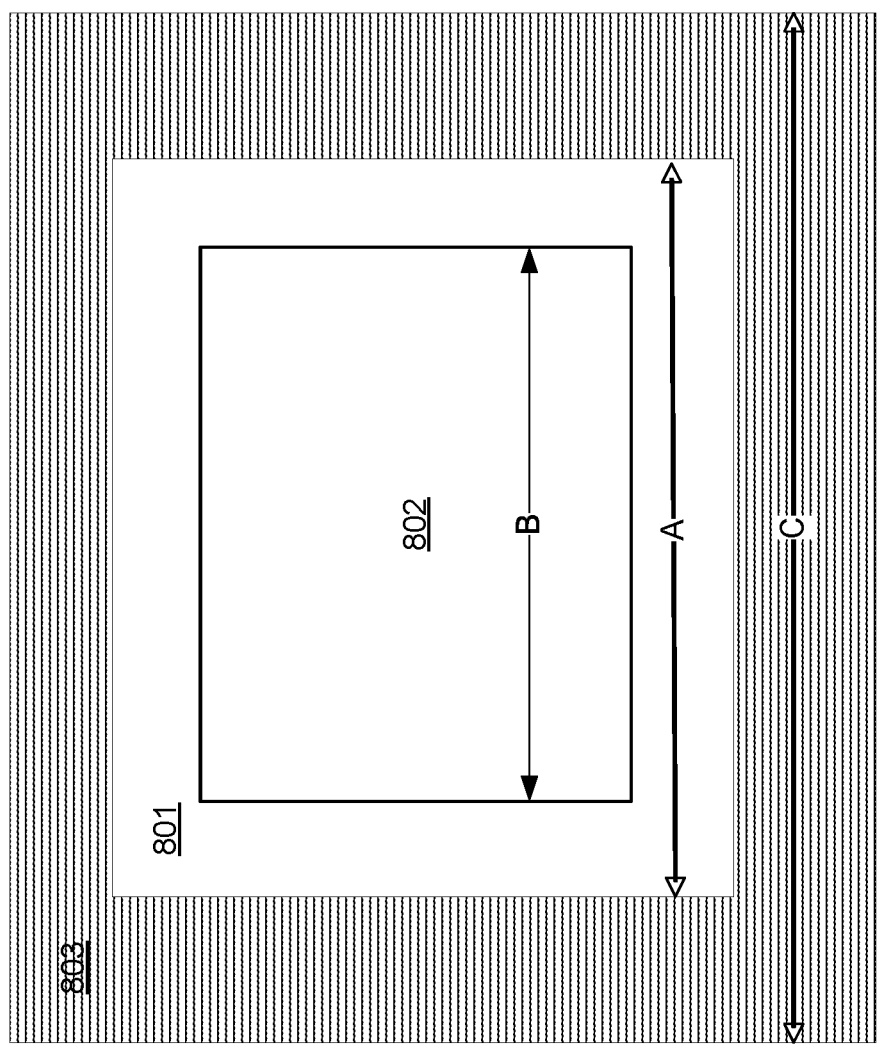
FIG. 8 shows schematic depicting relative sizes of an individual die, a solid spacer block, and a flexible spacer block.

Example power modules may include one or more power device dies (e.g., an IGBT and an FRD) that are coupled via the hybrid spacer blocks to DSC substrates. The hybrid spacer blocks may include flexible spacer blocks that are different (i.e. bigger or smaller) in size than the individual die size. FIG. 8 shows a diagram in which blocks representing an individual die 801, a solid spacer block 802, and a flexible spacer block 803 are overlaid for size comparison. Individual die 801 may have a characteristic size A, solid spacer block 802 may have a characteristic size B, and flexible spacer block 803 may have characteristic size C.

In example implementations, the die size A may be in the range of about 10 to 14 millimeters, and the flexible spacer block size C may be in the range of about 12 to 17 millimeters. Further, the hybrid spacer blocks may include solid spacer blocks that are different (e.g., smaller or equal) in size than the die size A. In example implementations, the solid spacer block size B may, for example, be in the range of about 6 to 10 millimeters for die size in the range of about 10 to 14 millimeters.

Figure 9:
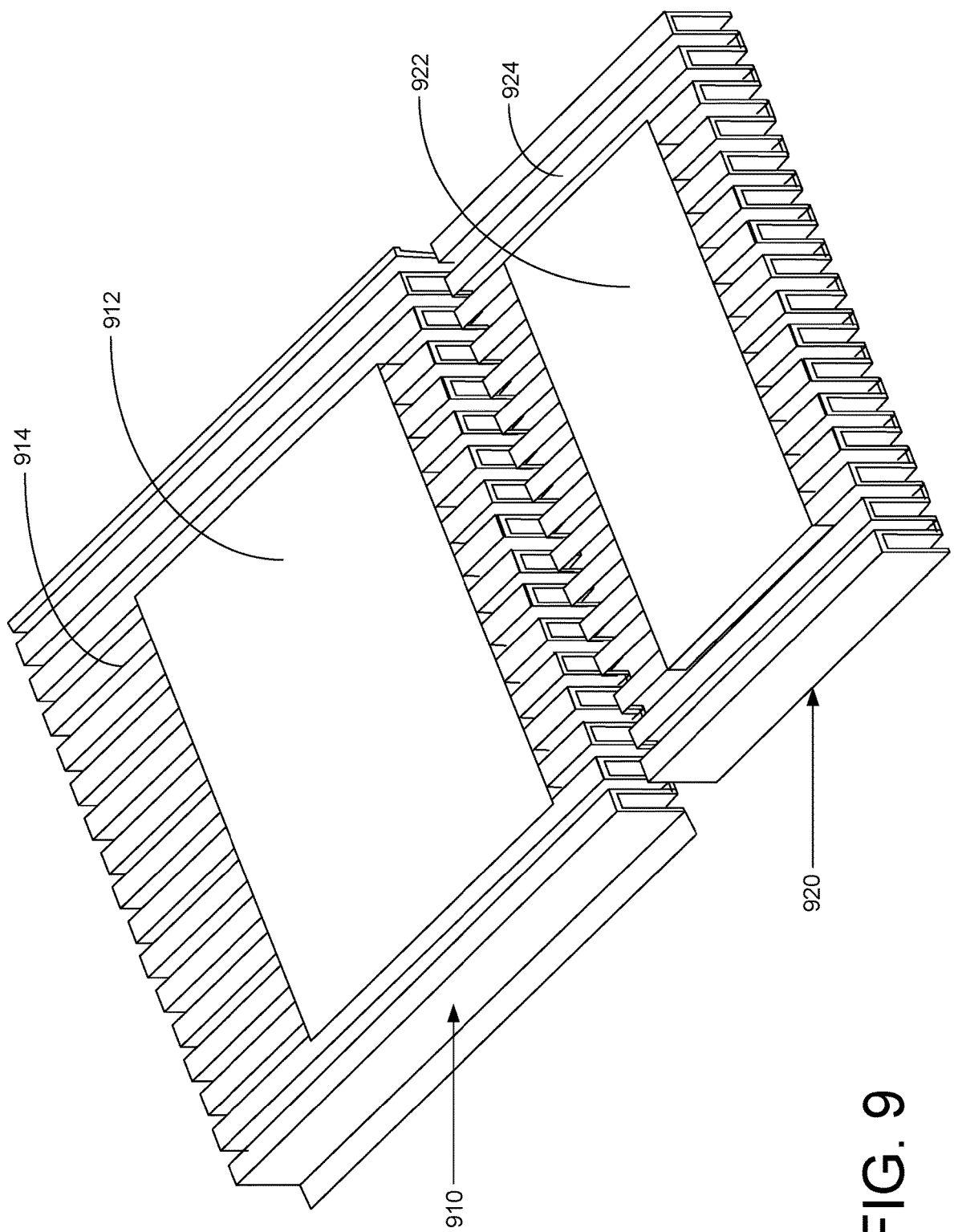
FIG. 9 is a schematic illustration of hybrid spacer blocks for use in a multi-die power module.

In example implementations of the hybrid spacer block (e.g., hybrid spacer block 140) discussed above with reference to FIGS. 1 through 8, the flexible spacer block surrounds the solid block portion. In a die-spacer block combination (e.g., die-spacer block combination 150), the flexible spacer block extends toward the die edges and can accommodate CTE mismatch stresses which may be pronounced at the die edges compared to the stresses at the die center. Each die in a multi-die power module may be coupled to a respective die-spacer block combination. FIG. 9 shows, for example, hybrid spacer 910 and hybrid spacer 920 that may be individually coupled to a first die (e.g., an IGBT) (not shown) and a second die (e.g., an FRD) (not shown) in a multi-die power module. Hybrid spacer 910 may include a solid metal block 912 surrounded by a flexible spacer block 914 coupled to the first die (e.g., an IGBT). Hybrid spacer 920 may include a solid metal block 922 surrounded by a flexible spacer block 924 coupled to the second die (e.g., an FRD).

Figure 10:
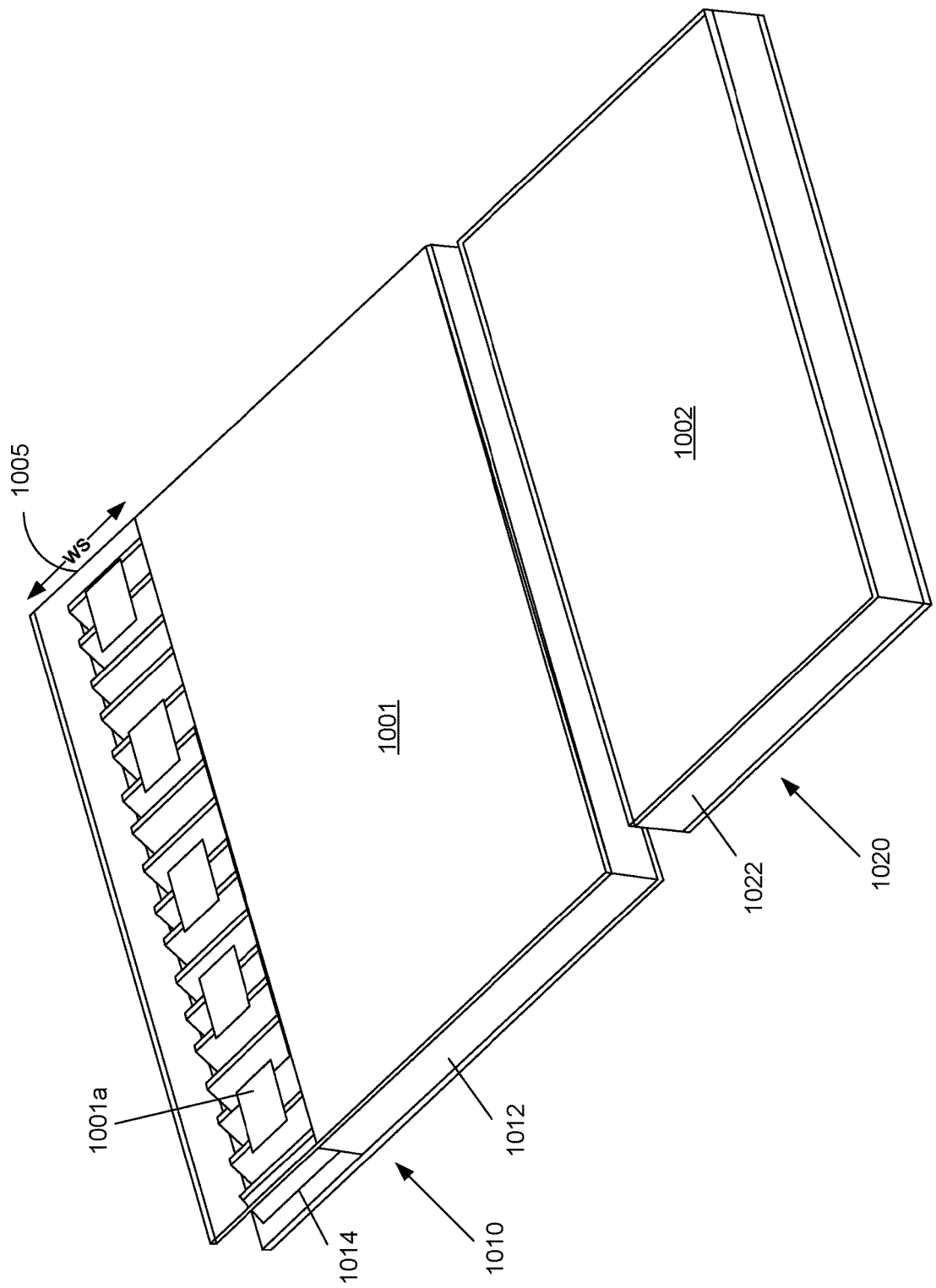
FIG. 10 is a schematic illustration an arrangement of hybrid spacer blocks that may be individually coupled to a first device die and a second device die in a multi-die power module.
Figure 11:
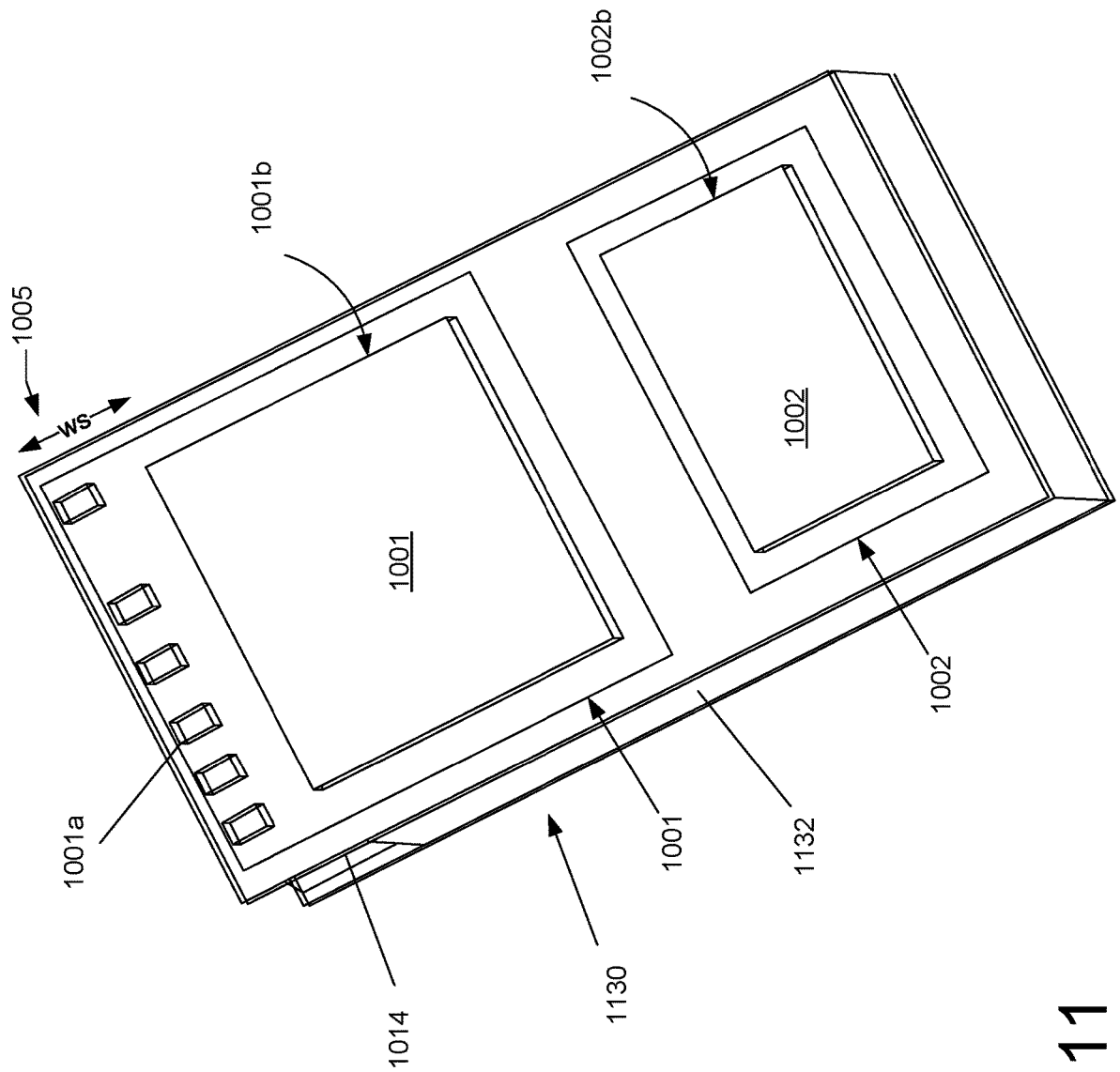
FIG. 11 is a schematic illustration of a hybrid spacer block coupled to a first device die and a second device die in a multi-die power module.
Figure 12:
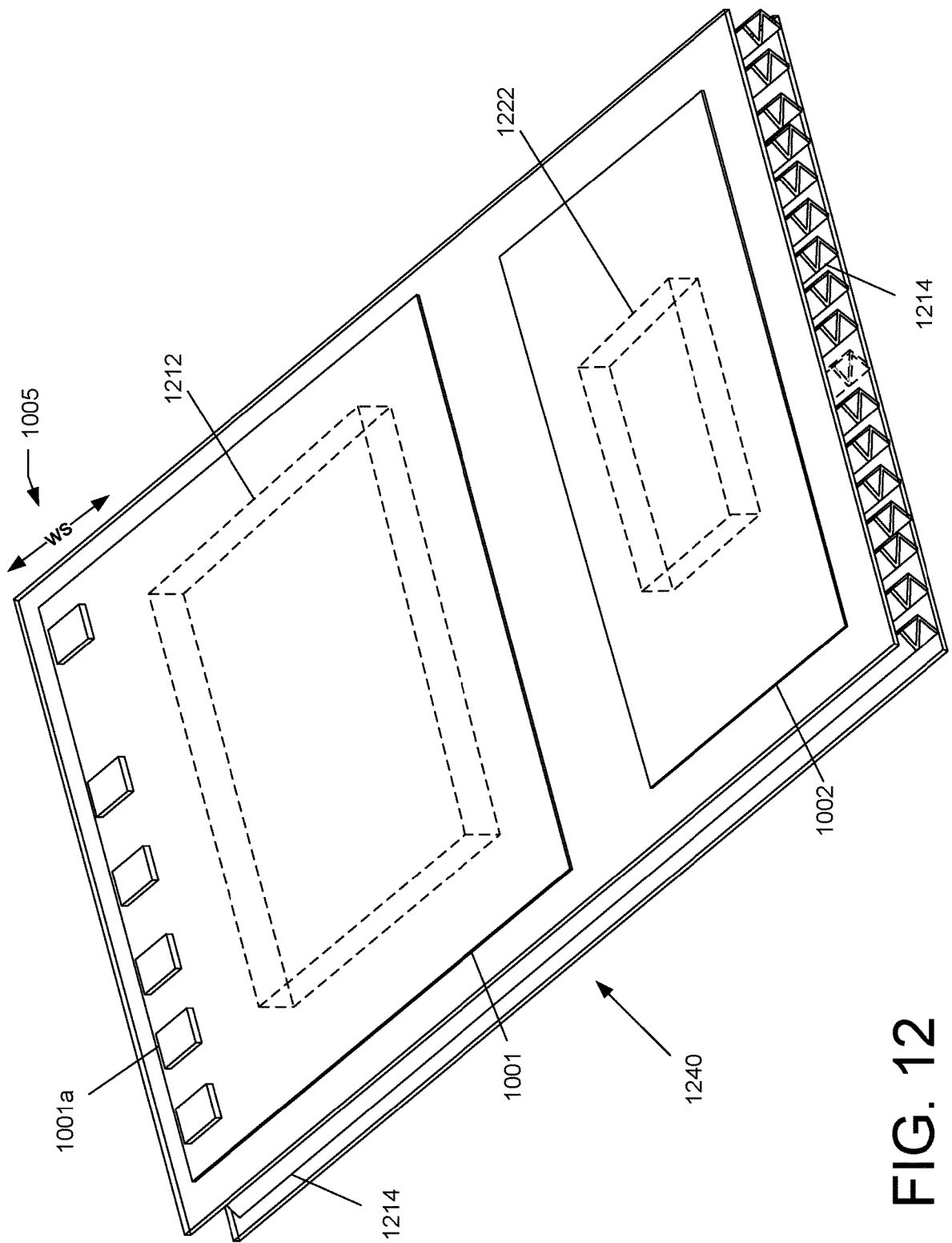
FIG. 12 is a schematic of a hybrid spacer block coupled to a first device die and a second device die in a multi-die power module.

In other implementations, hybrid spacer material (e.g., straight fin 201, tilted fin 202, bent fin 203, curved fin 204, and S-shaped fin 205) may be incorporated in a hybrid spacer block in different geometries (e.g., other than surrounding a single solid metal block on all sides). FIGS. 10 through 12 shows examples of different geometries of hybrid spacer material used in hybrid spacer blocks FIG. 10 shows, for example, an arrangement of hybrid spacer blocks 1010 and 1020 that may be individually coupled to a first device die 1001 (e.g., an IGBT) and a second device die 1002 (e.g., an FRD) in a multi-die power module. First device die 1001 may include a signal pad region 1005 including signal pads 1001*a* associated with the IGBT.

Hybrid spacer block 1010 may include a solid metal block 1012 and a flexible spacer block 1014. Solid metal block 1012 may be comparable in size to device die 1001 (e.g., an IGBT). Flexible spacer block 1014 may be a rectangular strip having a width WS. Flexible spacer block 1014 as a strip may be attached to, and extend from, a side of solid metal block 1012. Flexible spacer block 1014 may extend from the side of solid metal block 1012 to support (i.e., be bonded to) only signal pad region 1005 of first device die 1001, while solid metal block 1012 may support the remainder of the die in a die-spacer block combination.

In the example of FIG. 10, spacer block 1020 (that forms a die-spacer block combination with second device die 1002 (e.g., an FRD)) may include only a solid metal block 1022 and no flexible spacer block.

FIG. 11 shows, for example, a hybrid spacer block 1130 that may be coupled to both first device die 1001 (e.g., an IGBT) and second device die 1002 (e.g., an FRD) in a multi-die power module. First device die 1001 may include a signal pad region 1005 and a source pad 1001*b*. Second device die 1002 may include a source pad 1002*b*. Hybrid spacer block 1130 may include a single solid metal block 1132 that can form a dual die-spacer block combination with first device die 1001 and second device die 1002. Hybrid spacer block 1030 may, like hybrid spacer block 1010 (FIG. 10), further include flexible spacer block 1014 extending from a side of solid metal block 1130 to support only signal pad region 1005 of first device die 1001, FIG. 12 shows, for example, a hybrid spacer block 1240 that may be coupled to both first device die 1001 (e.g., an IGBT) and second device die 1002 (e.g., an FRD) in a multi-die power module. Hybrid spacer block 1240 may, like hybrid spacer blocks 1010 and 1020 (FIG. 10), include a first sub-block (i.e., a solid metal block 1212) and a second sub-block (i.e., a solid metal block 1222) that can be individually coupled to first device die 1001 and second device die 1002, respectively. Hybrid spacer block 1240 may further include a single flexible spacer block 1214 that supports signal pad region 1005 of first device die 1001 and extends away continuously from signal pad region 1005 to surround solid metal block 1212 and solid metal block 1222.

FIG. 13 shows an example method for using a flexible spacer block in a power module to accommodate component displacement that may occur, for example, due to CTE mismatch. The power module may include one or more device die (e.g., a FRD, an IGBT, etc.).

Method 1300 includes coupling an inner portion of a semiconductor device die to a solid spacer block (1310), disposing a flexible spacer block adjacent to the solid spacer block (1320), and coupling an edge portion of the semiconductor device die to the flexible spacer block (1330).

In method 1300, disposing a flexible spacer block adjacent to the solid spacer block can include disposing the solid spacer block in an opening in the flexible spacer block. Further, disposing a flexible spacer block adjacent to the solid spacer block can, alternatively or additionally, include disposing the flexible spacer block as strip attached to, and extending from, a side of the solid spacer block.

In method 1300, coupling the edge portion of the semiconductor device die to the flexible spacer block may include coupling the flexible spacer block to a signal pads region at the edge of the device die.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method, comprising:
    shaping a block of flexible spacer material, the shaping including cutting an opening in a portion of the block of flexible spacer material to receive a solid metal block; and
    coupling the solid metal block received in the opening to the portion of the block of flexible spacer material.

2. The method of claim 1, wherein the block of flexible spacer material has a corrugated structure made of alternate rectangular ridges and grooves with vertical sidewalls.

3. The method of claim 1, wherein the block of flexible spacer material has a corrugated structure including flexible structures that have non-vertical sidewalls.

4. The method of claim 1 further including:
    coupling a semiconductor die to the solid metal block in a semiconductor device module.

5. The method of claim 4, wherein coupling the semiconductor die includes coupling an inner portion of the semiconductor die to the solid metal block, and coupling an outer portion of the semiconductor die to the block of flexible spacer material.

6. A method, comprising:
    shaping a block of flexible spacer material, the shaping including defining an opening in a portion of the block of flexible spacer material to receive a solid metal block; and
    disposing the solid metal block in the opening of the portion of the block of flexible spacer material.

7. The method of claim 6, further comprising: applying a first bonding material to a first sheet of metal and placing the block of flexible spacer material including the solid metal block on the first sheet of metal.

8. The method of claim 7 wherein the first sheet of metal is a copper foil.

9. The method of claim 7, further comprising:
    applying a second bonding material to a top surface of the block of flexible spacer material including the solid metal block placed on the first sheet of metal and placing a second sheet of metal over the second bonding material.

10. The method of claim 9, wherein the second sheet of metal is a copper foil.

11. The method of claim 9, wherein the first bonding material and the second bonding material are solders, and the method further includes reflowing the solders and heat curing the first bonding material and the second bonding material.

12. The method of claim 7, wherein coupling the solid metal block to the portion of the block of flexible spacer material includes adding side foil panels to the opening.

13. A method, comprising:
    shaping a block made of flexible spacer material, the flexible spacer material including flexible structures that have non-vertical walls and are attached to a bottom foil;
    forming an opening in the block of flexible spacer material;
    disposing vertical side foil panels in the opening; and
    disposing a solid metal block on the bottom foil in the opening in the block of flexible spacer material.

14. The method of claim 13, wherein the bottom foil is a metal foil, and wherein the flexible spacer material includes a plurality of flexible fins attached to the metal foil.

15. The method of claim 14 further comprising dispensing a bottom solder layer on the metal foil in the opening, and disposing the solid metal block on the bottom solder layer in the opening.

16. The method of claim 15 further comprising: dispensing a side solder layer in a space between the vertical side foil panels and the solid metal block.

17. The method of claim 16 further comprising: disposing a top solder layer on the block of flexible spacer material including the solid metal block.

18. The method of claim 17 further comprising reflowing the bottom solder layer, the top solder layer, and the side solder layer.

19. A method, comprising:
coupling a flexible spacer block and a solid metal block to form a hybrid spacer block;
coupling an inner portion of a semiconductor die to the solid metal block;
coupling an outer portion of the semiconductor die to the flexible spacer block, the flexible spacer block being a strip attached to, and extending from, a side of the solid metal block toward an edge of the semiconductor die; and
bonding the hybrid spacer block to a substrate, the hybrid spacer block providing a thermal pathway for heat generated in the semiconductor die to the substrate.

20. The method of claim 19, wherein the flexible spacer block has a corrugated structure made of at least one of a straight fin, a tilted fin, a bent fin, a curved fin, or an S-shaped fin.

* * * * *